United States Patent
Saito et al.

(10) Patent No.: US 7,113,123 B2
(45) Date of Patent: Sep. 26, 2006

(54) ELECTROMAGNETIC WAVE ABSORBER AND A PROCESS OF PRODUCING SAME

(75) Inventors: Akihiko Saito, Nagoya (JP); Nobuaki Tanaka, Nagoya (JP)

(73) Assignee: Daido Tokushuko Kabushiki Kaisha, Nagoya (JP)

( * ) Notice: Subject to any disclaimer, the term of this patent is extended or adjusted under 35 U.S.C. 154(b) by 0 days.

(21) Appl. No.: 10/878,283

(22) Filed: Jun. 29, 2004

(65) Prior Publication Data

US 2005/0030217 A1    Feb. 10, 2005

(30) Foreign Application Priority Data

Jun. 30, 2003   (JP) .............................. 2003-187988

(51) Int. Cl.
 *H01Q 17/00*   (2006.01)
 *G01S 13/00*   (2006.01)

(52) U.S. Cl. .............................................. 342/1; 342/4

(58) Field of Classification Search ................. 342/1–4
See application file for complete search history.

(56) References Cited

U.S. PATENT DOCUMENTS 4,173,018 A * 10/1979 Dawson et al. ................ 342/1
5,110,651 A * 5/1992 Massard et al. ................ 342/1
5,338,617 A * 8/1994 Workinger et al. ............ 342/1
5,866,273 A * 2/1999 Wiggins et al. ................ 342/1
5,892,476 A * 4/1999 Gindrup et al. ................ 342/1
6,677,881 B1 * 1/2004 Okayama ....................... 342/4
6,870,497 B1 * 3/2005 Kondo et al. .................. 342/1

FOREIGN PATENT DOCUMENTS

JP    2003-060383    2/2003

* cited by examiner

*Primary Examiner*—Bernarr E. Gregory
(74) *Attorney, Agent, or Firm*—Oblon, Spivak, McClelland, Maier & Neustadt, P.C.

(57) ABSTRACT

An electromagnetic wave absorber having an excellent electromagnetic wave absorption characteristic in 5 to 6 GHz band. The electromagnetic wave absorber has a matrix and powder filled in the matrix. The particles of the powder have electrical conductivity at least in surface regions thereof and have a particle diameter of 3 to 20 μm as expressed by $D_{50}$ value. A volumetric ratio (V) in which the powder is filled in the matrix is set such that a standardized value expressed as a value obtained by dividing a complex relative permeability (μ") of the electromagnetic wave absorber in a frequency band to be absorbed thereby by the volumetric ratio (V) is constant as far as the particle diameter of the powder used, as expressed by the $D_{50}$ value, is within the range of 3 to 20 μm.

10 Claims, 3 Drawing Sheets

|  | $\delta_1$ | $\delta_2$ | ... | $\delta_x$ |
|---|---|---|---|---|
| $V_1$ | $P_{11}$ | $P_{21}$ | ... | $P_{x1}$ |
| $V_2$ | $P_{12}$ | $P_{22}$ | ... | $P_{x2}$ |
| ... | ... | ... | ... | ... |
| $V_y$ | $P_{1y}$ | $P_{2y}$ | ... | $P_{xy}$ |

ELECTROMAGNETIC WAVE ABSORBER AND A PROCESS OF PRODUCING SAME

This nonprovisional application claims priority under 35 U.S.C. § 119(a) on Patent Application No. 2003-187988 filed in Japan on Jun. 30, 2003, the entire contents of which are hereby incorporated by reference.

BACKGROUND OF THE INVENTION

1. Field of the Invention

The present invention relates to an electromagnetic wave absorber and a process of producing same, and more particularly, to an electromagnetic wave absorber which is so designed as to exhibit a stable electromagnetic wave absorption characteristic in a selected high-frequency band of 5 to 6 GHz and a process of producing such an electromagnetic wave absorber.

2. Description of the Related Art

Sheetlike material obtained by kneading a matrix, which may be rubber or various resins, for example, with soft magnetic powder and rolling the kneaded mixture into a sheet has been put to practical use as an electromagnetic wave absorber. Such an electromagnetic wave absorber is incorporated into various electric/electronic devices so as to absorb noise attributable to electromagnetic waves generated by these devices or propagated from other devices and thereby prevent malfunction etc. of the devices.

Recently, there is a tendency to use higher-frequency signals for driving electric/electronic devices and systems constituted by such devices. For example, use of the 5 GHz band in indoor wireless LAN is under study, and in the ETC system and DSRC (Dedicated Short Range Communications), the 5.8 GHz band is actually used.

Under the circumstances, the electromagnetic wave absorber incorporated into such systems is also required to have a good electromagnetic wave absorption characteristic in the high-frequency band.

To meet the requirements, Unexamined Japanese Patent Publication No. 2003-60383, for example, discloses an electromagnetic wave absorbing sheet as an electromagnetic wave absorber for use in high-frequency band, in which a matrix of polypropylene is filled with 25 to 40 volume % of soft magnetic powder having an average particle diameter of, for example, 3 µm or less.

Meanwhile, a very wide frequency range of electromagnetic waves is currently used in various applications. Accordingly, the electromagnetic wave absorbers need to exhibit excellent absorption characteristics in the frequency bands of their respective applications. Namely, it is not necessary that one electromagnetic wave absorber should have an excellent absorption characteristic over such a very wide frequency range. Instead, the electromagnetic wave absorber may have an excellent absorption characteristic in a particular selected frequency band, and then the absorber is sufficiently useful for systems using that frequency band.

SUMMARY OF THE INVENTION

An object of the present invention is to provide an electromagnetic wave absorber which is designed to exhibit an excellent absorption characteristic in a high-frequency band of 5 to 6 GHz and a process of producing such an electromagnetic wave absorber.

To achieve the object, the present invention provides an electromagnetic wave absorber for absorbing high-frequency electromagnetic waves in 5 to 6 GHz band. The electromagnetic wave absorber comprises a matrix; and powder filled in the matrix, particles of the powder having electrical conductivity at least in surface regions thereof and having a particle diameter of 3 to 20 µm as expressed by $D_{50}$ value, wherein a volumetric ratio (V) in which the powder is filled in the matrix is set such that a standardized value expressed as a value obtained by dividing a complex relative permeability ($\mu''$) of the electromagnetic wave absorber in a frequency band to be absorbed thereby by the volumetric ratio (V) is constant as far as the particle diameter of the powder used, as expressed by the $D_{50}$ value, is within the range of 3 to 20 µm.

DETAILED DESCRIPTION OF THE PREFERRED EMBODIMENTS

Figures 1, 2:
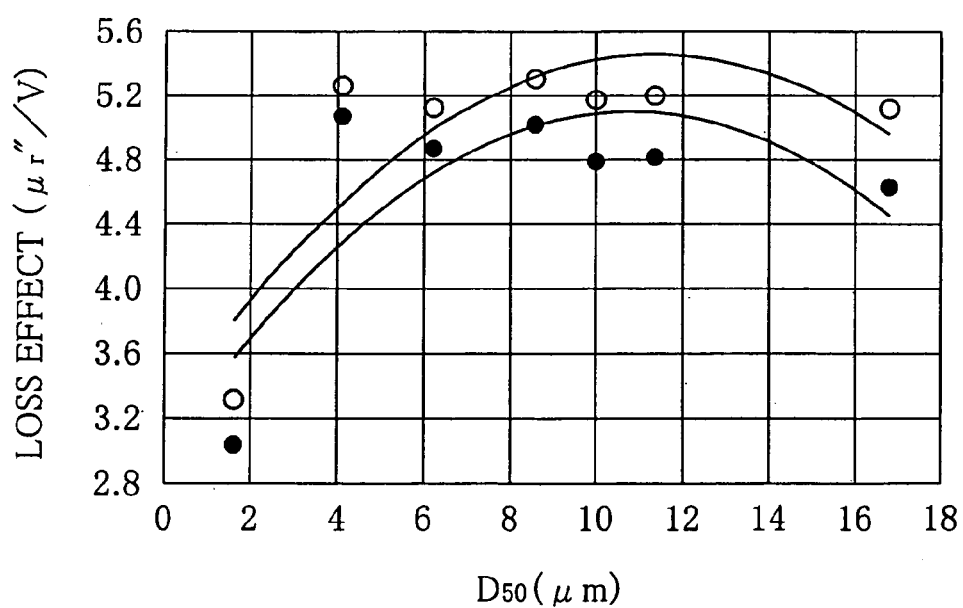
FIG. 1 is a map showing the correlation among thickness ($\delta$) of electromagnetic wave absorber, volumetric ratio (V) of powder and standardized value (P).
FIG. 2 is a graph showing the relationship between $D_{50}$ value of powder and loss effect at frequencies 5 GHz and 6 GHz of electromagnetic wave absorbers produced using the powder.

The inventors hereof directed their attention to an empirical fact that the frequency dependency of absorption characteristic of an electromagnetic wave absorber, which is obtained by forming a kneaded mixture of a matrix and soft magnetic powder into shape, is primarily influenced by factors which include the particle diameter of the soft magnetic powder dispersively filled in the matrix, the volumetric ratio of the powder, and the thickness of the electromagnetic wave absorber.

In view of this, the inventors examined the influence exerted on the absorption characteristic by these factors. The following was found out as a result:

In the case where electromagnetic wave absorbers are produced such that the volumetric ratio of the soft magnetic powder filled in the matrix is the same and also that the thicknesses of the absorbers are the same, the peak of the loss characteristic attributable to the powder shifts toward a higher-frequency side with decrease in the particle diameter of the soft magnetic powder.

Also, where the particle diameter of the powder used is the same, an electromagnetic wave absorber with a higher volumetric ratio of the powder tends to show a lower loss characteristic attributable to the powder in high-frequency band.

Further, where the thickness of the electromagnetic wave absorber is reduced, the peak of the absorption characteristic tends to shift toward a higher-frequency side.

Moreover, it was made clear that the thickness of the electromagnetic wave absorber to be formed is affected also by the volumetric ratio of the powder.

The "volumetric ratio" referred to herein is defined as the volume that the soft magnetic powder accounts for within the produced electromagnetic wave absorber, provided the volume of the electromagnetic wave absorber is 1.

Thus, the volumetric ratio, or V value, is smaller than 1, and the volume of the matrix used and the V value are in a relationship such that the sum of the two virtually equals 1.

The word "virtually" is used because air enters the material when the matrix is kneaded with the powder, thus forming air bubbles in the formed electromagnetic wave absorber, but the volume of the air bubbles is very small and negligible in practice.

In accordance with the above facts noted by the inventors, where soft magnetic powder with a certain particle diameter is used to produce an electromagnetic wave absorber, the absorption characteristic of the absorber is determined significantly by the volumetric ratio of the powder.

Meanwhile, when electromagnetic waves are made incident on the electromagnetic wave absorber, eddy current flows on the surfaces of the particles of the soft magnetic powder, so that the powder generates heat due to resistance. Namely, part of the incident electromagnetic energy is absorbed by the powder as eddy current loss, then converted to heat energy and consumed. Viewed from a different angle, the incident electromagnetic energy is partly lost due to the presence of the powder where eddy current flows.

Accordingly, the greater the loss, the better absorption characteristic the electromagnetic wave absorber exhibits with respect to incident electromagnetic waves. Generally, the measure of the absorption characteristic is determined by the magnitude of the imaginary part ($\mu_r''$) of the complex relative permeability of the electromagnetic wave absorber.

The inventors therefore inquired into an index representing the aforementioned loss effect of the electromagnetic wave absorber. Then, the inventors established a parameter which is obtained by dividing the imaginary part ($\mu_r''$) of the complex relative permeability of the electromagnetic wave absorber by the volumetric ratio (V) of the filled soft magnetic powder, to standardize the imaginary part ($\mu_r''$) of the complex relative permeability of the absorber with reference to the volumetric ratio (V).

Namely, the inventors conceived an idea that the peak of the absorption characteristic could possibly be made to fall within a target high-frequency band by controlling the standardized value.

The inventors conducted further study including the study of the particle diameter of the powder.

Specifically, the inventors produced electromagnetic wave absorbers with a certain thickness by kneading a matrix with soft magnetic powders of respective different particle diameters in a certain volumetric ratio and then forming the kneaded mixtures into shape. Then, with respect to each electromagnetic wave absorber, the standardized value ($\mu_r''$/V) in the 5 to 6 GHz band was obtained.

As a result, it was found out that the electromagnetic wave absorbers with an identical thickness and an identical volumetric ratio showed a constant standardized value ($\mu_r''$/V) in the 5 to 6 GHz band insofar as the particle diameter of the powder used, as expressed by $D_{50}$ value, was in the range of 3 to 20 μm, and that as far as the particle diameter was in the range of 3 to 20 μm, the standardized value was constant even if the particle diameter varied within that range.

The "$D_{50}$ value" referred to herein represents a value of particle diameter on the particle size distribution curve of the powder where the relative cumulative frequency reaches 50%, and the unit thereof is μm.

The standardized value ($\mu_r''$/V) is an index which indicates the degree to which the powder filled in an electromagnetic wave absorber contributes, per unit volume, to the absorption characteristic (electromagnetic wave absorbing power) of the electromagnetic wave absorber when electromagnetic waves are incident on the absorber. Thus, the standardized value represents the effect of the powder as to the magnitude of the loss and will be hereinafter referred to also as the loss effect.

In the process of the researches, powders of different materials were used, and it was also found out that, whether the powder used was a soft magnetic material or a non-magnetic, electrically conductive material, the peak of the absorption characteristic of the electromagnetic wave absorber could be made to fall within the 5 to 6 GHz band insofar as the powder had a particle diameter of 3 to 20 μm in terms of the $D_{50}$ value and the standardized value was within the aforementioned range.

The electromagnetic wave absorber of the present invention was developed in view of the aforementioned facts and knowledge. The particles of the powder used in the electromagnetic wave absorber have electrical conductivity at least in surface regions thereof and the $D_{50}$ value thereof is in the range of 3 to 20 μm. To produce an electromagnetic wave absorber, the powder is filled in a matrix such that the value obtained by dividing the imaginary part ($\mu_r''$) of the complex relative permeability of the produced absorber by the volumetric ratio (V) of the powder falls within the range of 3 to 20.

Thus, in the powder of the present invention for use in electromagnetic wave absorbers, the particles of the powder have a particle diameter of 3 to 20 μm in terms of the $D_{50}$ value and have electrical conductivity at least in the surface regions thereof.

In the case of powder having a $D_{50}$ value greater than 20 μm, the absorption characteristic of the electromagnetic wave absorber produced using the powder shows a peak value on a lower-frequency side than 5 GHz. In the case of powder having a $D_{50}$ value smaller than 3 μm, on the other hand, the absorption characteristic of the electromagnetic wave absorber produced using the powder shows a peak value on a higher-frequency side than 6 GHz. In either case, the absorption characteristic in the target frequency band of 5 to 6 GHz lowers.

It is essential that the particles of the powder have electrical conductivity at least in the surface regions thereof. If at least the surface regions of the particles do not have electrical conductivity, no eddy current flows on the surfaces of the particles when high-frequency electromagnetic waves are incident on the electromagnetic wave absorber, with the result that the electromagnetic waves fail to be absorbed. The electrical conductivity of the particles may be 10,000 μΩ·cm or less in terms of electrical resistivity.

For the material of the powder, various soft magnetic materials conventionally known may be used. It should be noted, however, that the material of the powder is not limited to soft magnetic materials and may be any material, for example, non-magnetic materials such as Al powder, Cu powder or carbon powder, insofar as the particles of the powder have electrical conductivity at least in surface regions thereof.

The particles of the powder may be either solid particles or balloon-like hollow particles. Cores of the particles may be made of a ceramic material or an electrical insulating material, for example, and electrical conductivity may be imparted to the surfaces of the cores by, for example, plating the cores with an electrically conductive material.

In the case where the material of the powder is a soft magnetic material, the powder may be obtained by an atomization process. Where the powder is produced by water atomization, for example, the soft magnetic material is pulverized with the opening diameter of the spray nozzle, the discharge flow rate of the molten metal, the pressure of the water swirl jet, etc. suitably selected, and then the resultant powder is classified. The powder obtained by the water atomization may be classified after being crushed by means of an attritor, for example.

The electromagnetic wave absorber of the present invention is produced in the manner described below.

Step 1. A map showing the correlation among the thickness (δ) of electromagnetic wave absorber, the volumetric ratio (V) of powder mixed in the matrix and the standardized value ($\mu_r''/V$) is prepared.

Specifically, electromagnetic wave absorbers with various combinations of thicknesses δ1, δ2, . . . , δx and volumetric ratios V1, V2, . . . , Vy are produced beforehand. Then, with respect to each electromagnetic wave absorber, the complex relative permeability in the 5 to 6 GHz band is measured to obtain the standardized value Pxy, thereby creating a correlation map as shown in FIG. 1.

Step 2. The thickness of an electromagnetic wave absorber to be produced and the $D_{50}$ value of powder to be used are determined. The $D_{50}$ value is within the range of 3 to 20 μm.

Step 3. Using the correlation map shown in FIG. 1, a standardized value (Pxy) corresponding to the δ value determined in Step 2 is obtained, and a volumetric ratio (V) corresponding to the obtained Pxy value is determined.

Step 4. The powder determined in Step 2 is kneaded with a matrix in the volumetric ratio determined in Step 3, and the kneaded mixture is formed so as to have the thickness determined in Step 2.

For the matrix, rubber or resin, such as chlorinated polyethylene, epoxy, polyphenylene sulfide or nylon, may be used, for example.

EXAMPLES

Fe—Cr—Si-based powder was obtained by water atomization and was classified according to size to prepare seven groups of powders with respective particle diameters falling within the range of 1 to 20 μm in terms of the $D_{50}$ value.

Chlorinated polyethylene, prepared as the matrix, was kneaded with each of the powders obtained in the manner described above such that the volumetric ratio (V) of the powder was 0.3.

Each of the kneaded mixtures thus obtained was formed into a sheet to obtain an electromagnetic wave absorber.

The complex relative permeability of each of the electromagnetic wave absorbers at the frequencies 5 GHz and 6 GHz was measured, and from the imaginary part ($\mu_r''$) of the derived complex relative permeability, the loss effect ($\mu_r''/V$) was calculated.

FIG. 2 shows the relationship between $\mu_r''/V$ and $D_{50}$ value observed when electromagnetic waves of the respective frequencies were incident on the individual electromagnetic wave absorbers.

In FIG. 2, ○ indicates the results obtained in the case of the frequency 5 GHz, and ● indicates the results obtained in the case of the frequency 6 GHz.

As is clear from FIG. 2, the electromagnetic wave absorbers using the powders whose $D_{50}$ values were within the range of 3 to 17 μm showed a loss effect greater than 4.4 at both frequencies 5 GHz and 6 GHz.

Similar results could be obtained also in the case where Fe—Cr-based powder, Fe—Cr—Al-based powder or Fe—Si—Al-based powder was used in place of the aforementioned powder.

Consequently, the powder according to the present invention is useful as powder to be used in electromagnetic wave absorbers adapted to absorb electromagnetic waves in the 5 to 6 GHz band.

This advantage is obtained because the particles of the powder used in the electromagnetic wave absorber have electrical conductivity at least in the surface regions thereof and have a particle diameter of 3 to 20 μm in terms of the $D_{50}$ value and also because the volumetric ratio (V) of the powder and the imaginary part ($\mu_r''$) of the complex relative permeability of the electromagnetic wave absorber are adjusted so that the value $\mu_r''/V$ may fall within the range of 3 to 20.

Figure 3:
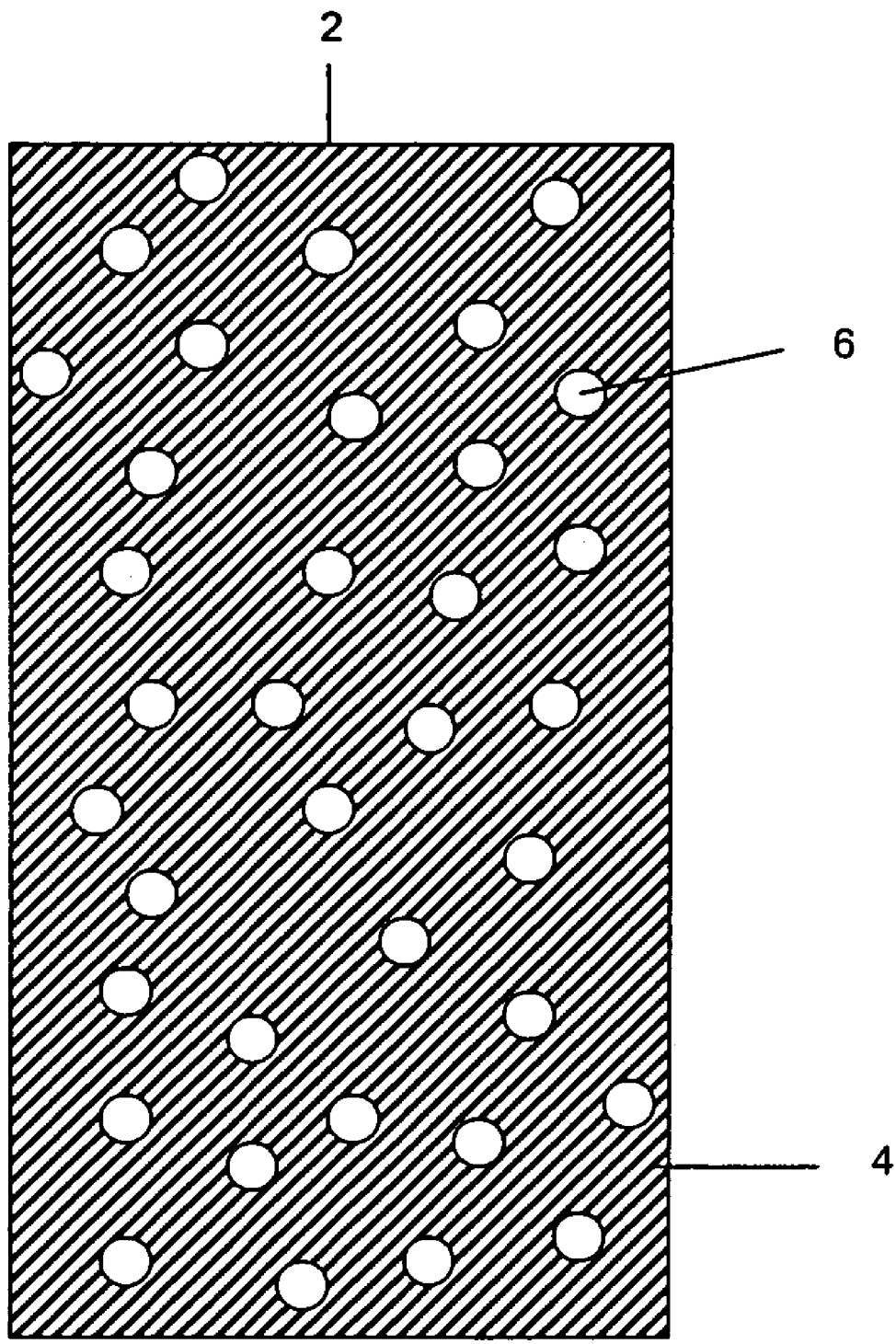
FIG. 3 is a schematic depiction of an electromagnetic wave absorber according to one embodiment of the present invention.

As shown in FIG. 3, in one embodiment of the present invention there is provided an electromagnetic wave absorber for absorbing high-frequency electromagnetic waves in 5 to 6 GHz band. The electromagnetic wave absorber 2 includes a matrix 4 and a powder 6 filled in the matrix 4. Particles of the powder 6 have electrical conductivity at least in surface regions thereof and have a particle diameter of 3 to 20 μm as expressed by a $D_{50}$ value. A volumetric ratio (V) in which the powder is filled in the matrix is set such that a standardized value expressed as a value obtained by dividing a complex relative permeability ($\mu''$) of the electromagnetic wave absorber in a frequency band to be absorbed thereby by the volumetric ratio (V) is constant as far as the particle diameter of the powder used, as expressed by the $D_{50}$ value, is within the range of 3 to 20 μm.

The standardized value can be set at a constant value in the range of 3 to 20 with reference to thickness of the electromagnetic wave absorber 2 and the volumetric ratio in which the powder 6 is filled in the matrix 4, irrespective of kind of the powder used. The powder 6 can be a soft magnetic powder such as for example one or more powders selected from Fe—Cr—Si-based powder, Fe—Cr-based powder, Fe—Cr—Al-based powder, and Fe—Si—Al-based powder. The powder 6 can have an electrical resistivity of 10,000 μΩ·cm or less.

Figure 4:
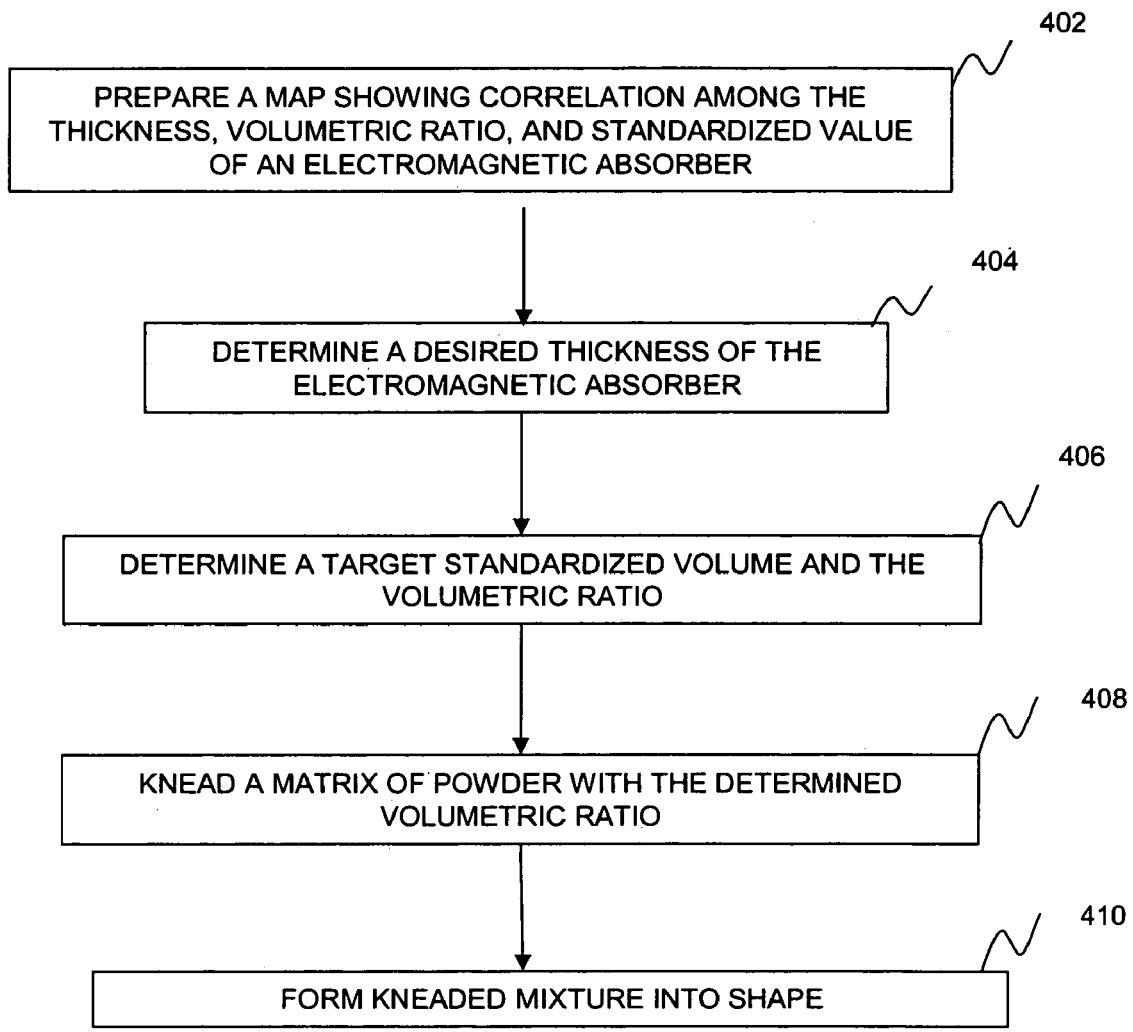
FIG. 4 is a flowchart depicting a process for producing an electromagnetic wave absorber according to one embodiment of the present invention.

FIG. 4 is a flowchart depicting a process for producing an electromagnetic wave absorber according to one embodiment of the present invention. In step 402, a map is prepared beforehand showing correlation among (1) the thickness of the electromagnetic wave absorber, (2) the volumetric ratio in which powder is filled in a matrix, and (3) the standardized value (the standardized value being expressed as a value obtained by dividing a complex relative permeability ($\mu''$) of the electromagnetic wave absorber in 5 to 6 GHz frequency band to be absorbed thereby by the volumetric ratio (V)). In step 404, a desired thickness of an electromagnetic wave absorber to be produced and a $D_{50}$ value of powder to be used are determined. In step 406, from the correlation map, a target standardized value and a volumetric ratio (V) corresponding to the determined thickness of the electromagnetic wave absorber are determined. In step 408, a matrix is kneaded with the powder in the determined volumetric ratio (V). In step 410, the obtained kneaded mixture is formed into shape.

In step 402, the standardized value can be set at a constant value in the range of 3 to 20 with reference to the thickness of the electromagnetic wave absorber and the volumetric ratio (V) in which the powder is filled in the matrix, irrespective of kind of the powder used. As before, in this process, the powder can be a soft magnetic powder such as for example one or more powders selected from Fe—Cr—Si-based powder, Fe—Cr-based powder, Fe—Cr—Al-based powder, and Fe—Si—Al-based powder. The powder can have an electrical resistivity of 10,000 μΩ·cm or less.

What is claimed is:

1. An electromagnetic wave absorber for absorbing high-frequency electromagnetic waves in 5 to 6 GHz band, comprising:
    a matrix; and
    a powder filled in said matrix, particles of said powder having electrical conductivity at least in surface regions thereof and having a particle diameter of 3 to 20 μm as expressed by $D_{50}$ value,
    wherein said powder is filled in proportion to said matrix to a volumetric ratio (V) set such that a standardized value expressed as a value obtained by dividing a complex relative permeability ($\mu''$) of the electromagnetic wave absorber in a frequency band to be absorbed thereby by the volumetric ratio (V) is constant as far as the particle diameter of said powder used, as expressed by the $D_{50}$ value, is within the range of 3 to 20 μm.

2. The electromagnetic wave absorber according to claim 1, wherein said standardized value is set at a constant value in the range of 3 to 20 with reference to thickness of said electromagnetic wave absorber and the volumetric ratio in which said powder is filled in said matrix, irrespective of kind of said powder used.

3. The electromagnetic wave absorber according to claim 1, wherein said powder is soft magnetic powder.

4. The electromagnetic wave absorber according to claim 3, wherein said soft magnetic powder is one or more powders selected from Fe—Cr—Si-based powder, Fe—Cr-based powder, Fe—Cr—Al-based powder, and Fe—Si—Al-based powder.

5. The electromagnetic wave absorber according to any one of claims 1 to 4, wherein said powder has an electrical resistivity of 10,000 μΩ·cm or less.

6. A process of producing an electromagnetic wave absorber for absorbing high-frequency electromagnetic waves in 5 to 6 GHz band, comprising the steps of:
    preparing beforehand a map showing correlation among thickness of the electromagnetic wave absorber, volumetric ratio in which powder is filled in a matrix, and standardized value, the standardized value being expressed as a value obtained by dividing a complex relative permeability ($\mu''$) of the electromagnetic wave absorber in 5 to 6 GHz frequency band to be absorbed thereby by the volumetric ratio (V);
    determining a desired thickness of an electromagnetic wave absorber to be produced and a $D_{50}$ value of powder to be used;
    determining, from the correlation map, a target standardized value and a volumetric ratio (V) corresponding to the determined thickness of the electromagnetic wave absorber;
    kneading a matrix with the powder in the determined volumetric ratio (V); and
    forming the obtained kneaded mixture into shape.

7. The process according to claim 6, wherein said standardized value is set at a constant value in the range of 3 to 20 with reference to the thickness of the electromagnetic wave absorber and the volumetric ratio (V) in which the powder is filled in the matrix, irrespective of kind of the powder used.

8. The process according to claim 6, wherein said powder is soft magnetic powder.

9. The process according to claim 8, wherein said soft magnetic powder is one or more powders selected from F—Cr—Si-based powder, Fe—Cr-based powder, F—Cr—Al-based powder, and Fe—Si—Al-based powder.

10. The process according to any one of claims 6 to 9, wherein said powder has an electrical resistivity of 10,000 μΩ·cm or less.

* * * * *